(12) United States Patent
Khan et al.

(10) Patent No.: US 7,776,696 B2
(45) Date of Patent: Aug. 17, 2010

(54) METHOD TO OBTAIN MULTIPLE GATE THICKNESSES USING IN-SITU GATE ETCH MASK APPROACH

(75) Inventors: Imran Khan, Sunnyvale, CA (US); Ahmed Shibly, San Jose, CA (US); Dong-Hyuk Ju, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 554 days.

(21) Appl. No.: 11/741,998

(22) Filed: Apr. 30, 2007

(65) Prior Publication Data

US 2008/0268630 A1   Oct. 30, 2008

(51) Int. Cl.
*H01L 21/8234* (2006.01)
(52) U.S. Cl. .................. 438/275; 257/E21.624
(58) Field of Classification Search .......... 438/157, 438/257, 275, 283
See application file for complete search history.

(56) References Cited

U.S. PATENT DOCUMENTS

| | | | |
|---|---|---|---|
| 6,204,159 B1 * | 3/2001 | Chang et al. ............. 438/594 |
| 6,522,587 B1 * | 2/2003 | Furuhata et al. ......... 365/185.28 |
| 6,562,717 B1 | 5/2003 | Woo et al. | |
| 6,781,193 B2 * | 8/2004 | Lee et al. ................. 257/326 |
| 6,838,725 B2 | 1/2005 | Lin et al. | |
| 7,037,794 B2 | 5/2006 | Beintner et al. | |
| 7,084,453 B2 | 8/2006 | Chern et al. | |
| 2002/0098703 A1 * | 7/2002 | Chien et al. ............. 438/694 |
| 2004/0209468 A1 * | 10/2004 | Kumar et al. ............ 438/689 |
| 2005/0266692 A1 * | 12/2005 | Brask et al. ............. 438/717 |

* cited by examiner

*Primary Examiner*—Chandra Chaudhari
(74) *Attorney, Agent, or Firm*—Turocy & Watson, LLP

(57) ABSTRACT

Making gates having multiple thicknesses on the same substrate in a given process flow is provided. For example, a method of making a semiconductor structure having at least two gates of different thickness involves forming a first gate layer having a first thickness; patterning a first hard mask over a portion of the first gate layer to define a first gate underneath the first hard mask having a first gate thickness; forming a second gate layer having a second thickness over the first gate layer and the first hard mask; patterning a second hard mask over a portion of the second gate layer to define a second gate underneath the second hard mask having a second gate thickness; removing portions of the first gate layer and the second gate layer that are not under the first hard mask and the second hard mask; and removing the first hard mask and the second hard mask to provide two gates of different thicknesses.

20 Claims, 3 Drawing Sheets

US 7,776,696 B2

METHOD TO OBTAIN MULTIPLE GATE THICKNESSES USING IN-SITU GATE ETCH MASK APPROACH

TECHNICAL FIELD

The subject invention generally relates to making a plurality of gates each having a thickness that may be different on the same substrate in a given process flow.

BACKGROUND

Dimensions of the high speed CMOS gate length including polysilicon gate thickness scales in line with the reducing lithography node. Generic CMOS processes that have transistors optimized for the high speed Vcc operation and the slightly higher voltage I/O typically use a single polysilicon gate thickness. The Flash process, however, requires a discrete set of transistors for the core cell (non-volatile memory cells), as well as high speed CMOS (Vcc) and high voltage circuitry. Different types of transistors have different functions, and thus have different preferred dimensions.

Furthermore, an increasing number of semiconductor integrated circuits containing a non-volatile memory cell array and logic circuits are in demand due to the enhanced value provided. The transistors of a non-volatile memory cell array may have a stacked gate structure. The peripheral circuits for a non-volatile memory cell array may include high breakdown voltage transistors that have a drive circuit which handles high voltages (program/erasure, etc.) required for driving the memory cells. The peripheral circuits may also include a low voltage transistor circuit to perform logical functions and data manipulation at high speeds.

The manufacturing processes of different types of transistors are different and therefore may have poor compatibility. Therefore, this type of non-volatile semiconductor memory device gives rise to a great increase in number of steps and costs if it is to be integrated in the same semiconductor chip together with a peripheral logic circuit such as a CPU or an MPU.

SUMMARY

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides reliable and controlled process techniques that enable the flexibility to engineer multiple gate thicknesses in a given process flow in a cost effective and efficient manner. Consequently, it is possible to tailor a specific, desired gate thickness to a given type of transistor, and make multiple types of transistors each having a thickness ideally suited to its end use on a single substrate in a single process flow. Compromises often made to best accommodate multiple types of transistors with a single thickness are eliminated. Multiple process flows involving making and stripping entire portions of a substrate in order to obtain multiple types of transistors with different thicknesses are also eliminated.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
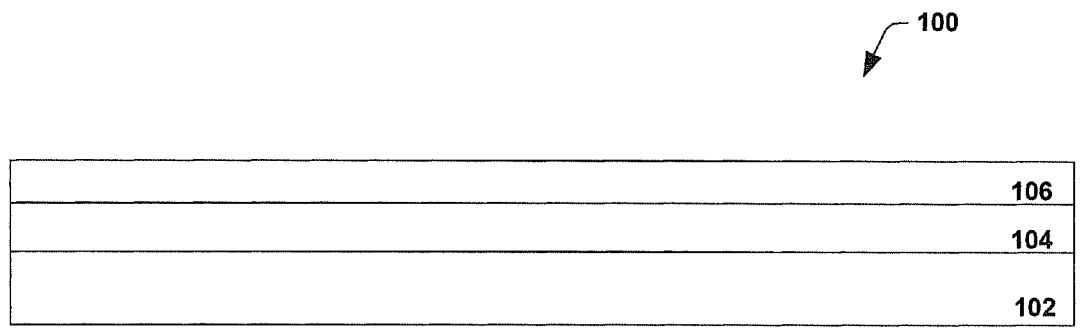
FIG. 1 is a cross sectional illustration of one aspect of a making a multiple gate thicknesses structure in accordance with the subject invention.

Typically, in the contemporary flash fabrication process, a single polysilicon gate layer is deposited for the various different types of transistors (such as non-volatile memory cells, high speed CMOS transistors, I/O transistors, select transistors, and the like). However, as the scaling of the high speed CMOS transistors progresses within a flash die, a thinner polysilicon gate is needed as the drawn gate length is reduced. The reduction of the polysilicon gate thickness for the core cell and high voltage transistors may not be possible due to their own device requirements. Other issues impact transistor size, such as implant penetration for high voltage transistors and fringing fields for the array core memory cells. Hence different gate thicknesses are needed for the different types of transistors on a given substrate, especially in a flash process.

Another concern in decreasing the size of non-volatile memory cell transistors is the occurrence of stress-induced leakage current and the consequent undermining of the ability to store charge. This, however, is not a concern for an advanced CMOS logic process. The subject invention involves making gates of different thicknesses (or different sets of gates, each set having a different thickness) on the same substrate in a given process flow is provided.

The invention is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention.

Referring to FIG. 1, a structure 100 is shown where initially a substrate 102 is provided. The substrate is typically a silicon substrate optionally with various elements, regions and/or layers thereover; including metal layers, barrier layers, dielectric layers, device structures, transistors, active regions such as active silicon regions or areas, active elements and passive elements including additional gates, wordlines, source regions, drain regions, bit lines, bases, emitters, collectors, conductive lines, conductive plugs, etc. That is, with regard to the description in connection with FIGS. 1-8, the term substrate includes not only a substrate 102, such as semiconductor substrate, but also any and all layers and structures fabricated over the semiconductor substrate up to the point of processing under discussion, such as substrate with a gate oxide layer thereover.

Over a portion or the entire substrate 102, a first gate layer 104 is formed. When forming the first gate layer 104 over a portion of the substrate 102, the first gate layer 104 may be formed in the core region, periphery region, or portions of both the core region and periphery region. The first gate layer 104 is formed to have any suitable thickness, although the thickness corresponds to the subsequently formed first gate thickness.

The first gate layer (or any gate layer such as the second gate layer, the third gate layer, the fourth gate layer, the fifth gate layer, and so on) contain a material suitable for use as a gate. The most common gate material is polysilicon. Additional examples of gate materials include doped amorphous silicon, silicides (silicon doped with metal such nickel), fully silicided gate stacks (FUSI), metallic materials such as aluminum, AlGaAs, titanium nitride, tantalum nitride, tungsten, doped polysilicon, silicon containing films, and the like. When metallic materials are employed as the gate material, often high K dielectrics (such as hafnium oxide, titanium oxide, tantalum oxide, zirconium oxide, and the like) are also employed in the semiconductor device. Use of any particular gate material is not critical to the teachings herein.

The first gate layer 104 may be formed in any suitable manner including chemical vapor deposition (CVD), for example. The thickness of the first gate layer 104 is typically from about 100 Å to about 5,000 Å. In another embodiment, the thickness of the first gate layer 104 is from about 250 Å to about 2,500 Å. In another embodiment, the thickness of the first gate layer 104 is from about 500 Å to about 2,000 Å.

Over a portion but typically the entire first gate layer 104, a first hard or etch mask layer 106 is formed. The first etch mask layer 106 has a suitable thickness to function as a hard mask for subsequently etching portions of the first gate layer 104, but yet a relative thinness to facilitate overall processing. For example, the thickness of the first etch mask layer 106 is about 2,500 Å or less. In another embodiment, the thickness of the first etch mask layer 106 is about 1,000 Å or less.

The first etch mask layer 106 can be a thin layer of a material that can provide etch selectivity with the gate material (high etch selectivity whether selectively removing the gate material and not an etch mask material, or selectively removing an etch mask material and not the gate material). In one embodiment, the etch selectivity between the materials of the etch mask layer and the gate material is at least about 10:1. In another embodiment, the etch selectivity between the materials of the etch mask layer and the gate material is at least about 25:1. In yet another embodiment, the etch selectivity between the materials of the etch mask layer and the gate material is at least about 50:1. The etch selectivity of the etch mask layer and the gate layer is maintained for all etch mask layers and gate layers (not only for the first etch mask layer and first gate layer, but also for the second etch mask layer and second gate layer, the third etch mask layer and third gate layer, the fourth etch mask layer and fourth gate layer, and so on).

Examples of materials that may be employed to make the first etch mask layer 106 include silicon oxide (including high temperature oxide grown by thermal techniques, oxides deposited by CVD techniques, and glasses formed by spin-on techniques), silicon nitride, silicon oxynitride, fluorine doped silicon glass (FSG), tetraethylorthosilicate (TEOS), phosphosilicate glass (PSG), borophosphosilicate glass (BPSG), any suitable spin-on glass, or low k polymer materials. Low k polymer materials include polyimides, fluorinated polyimides, polysilsequioxane, benzocyclobutene (BCB), parlene F, parlene N and amorphous polytetrafluoroethylene.

Figure 2:
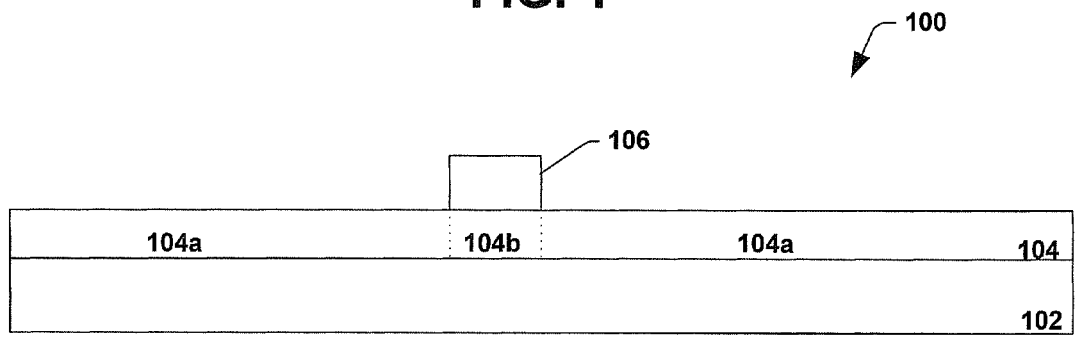
FIG. 2 is a cross sectional illustration of one aspect of a making a mask for a first gate thickness of a multiple gate thicknesses structure in accordance with the subject invention.

Referring to FIG. 2, the first etch mask layer 106 is patterned on structure 100 so that subsequently formed first gate portions 104b of the first gate layer 104 remain covered/protected by the patterned first etch mask layer 106 (that is, 104b corresponds to portions of the first gate layer 104 underneath the patterned first etch mask layer 106) while other portions 104a of the first gate layer 104 are exposed. The first etch mask layer 106 can be patterned using suitable photolithography techniques. For example, a photoresist (not shown) can be employed as a mask for patterning the first mask layer 106. The patterned first etch mask layer 106 defines one or more subsequently formed gates having a first thickness. The structure 100 may then be optionally cleaned to remove residue from the exposed portions 104a of the first gate layer 104.

Due to the high etch selectivity between the materials of the etch mask layer and the gate layer, the exposed portions 104a of the first gate layer 104 are unaltered (or at least substantially unaltered). Dry or wet etching techniques may be employed. General examples of etch materials for selectively removing portions of the etch mask layer without removing gate material include fluorocarbons. Examples of etch materials for selectively removing portions of the etch mask layer without removing gate material include buffered HF, $SF_6$, $NF_3$, $CF_4$, $C_2F_6$, CO, $C_4F_8$, $CHF_3$, Ar, $BF_3$, $CH_3F$, $CF_4$, and combinations thereof. Optionally, any of the etchants may be supplemented with an inert gas and/or Ar, $H_2$, or $O_2$.

When selectively etching a etch mask layer containing silicon oxide, preferred etchants include buffered HF, $SF_6$, $NF_3$, $CF_4$, $C_2F_6$, CO, $C_4F_8$, $CHF_3$, and combinations thereof. When selectively etching a etch mask layer containing silicon nitride, preferred etchants include $BF_3$, $NF_3$, $SF_6$, $CH_3F$, $CF_4$, $CHF_3$, and combinations thereof. When selectively etching a etch mask layer containing BPSG, preferred etchants include Ar and one of $CF_4$ and $CHF_3$.

Figure 3:
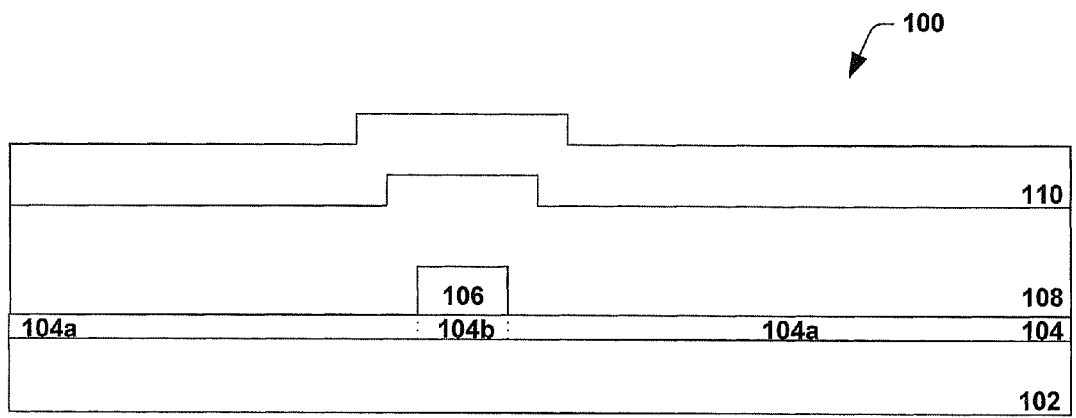
FIG. 3 is a cross sectional illustration of one aspect of a making a multiple gate thicknesses structure in accordance with the subject invention.

Referring to FIG. 3, a second gate layer 108 is formed over a portion or the entire structure 100. The second gate layer 108 is formed to have any suitable thickness, although the thickness combined with the thickness of the first gate layer 104 corresponds to the subsequently formed second gate thickness.

The second gate layer 108 may be formed in any suitable manner including CVD, for example. The thickness of the second gate layer 108 is typically from about 100 Å to about 5,000 Å. In another embodiment, the thickness of the second gate layer 108 is from about 250 Å to about 2,500 Å. In another embodiment, the thickness of the second gate layer 108 is from about 500 Å to about 2,000 Å.

Over a portion but typically the entire second gate layer 108, a second hard or etch mask layer 110 is formed. The second etch mask layer 110 can be a thin layer of a material that can provide etch selectivity with the gate material. The second etch mask layer 110 has a suitable thickness to function as a hard mask for subsequently etching portions of the second gate layer 108 and the first gate layer 104, but yet a relative thinness to facilitate overall processing. For example, the thickness of the second etch mask layer 110 is about 2,500 Å or less. In another embodiment, the thickness of the second etch mask layer 106 is about 1,000 Å or less.

Examples of materials that may be employed to make the second etch mask layer 110 are the same as those of the first etch mask layer 106. However, the second etch mask layer 110 are the same as those of the first etch mask layer 106 may contain the same or different materials.

Figure 4:
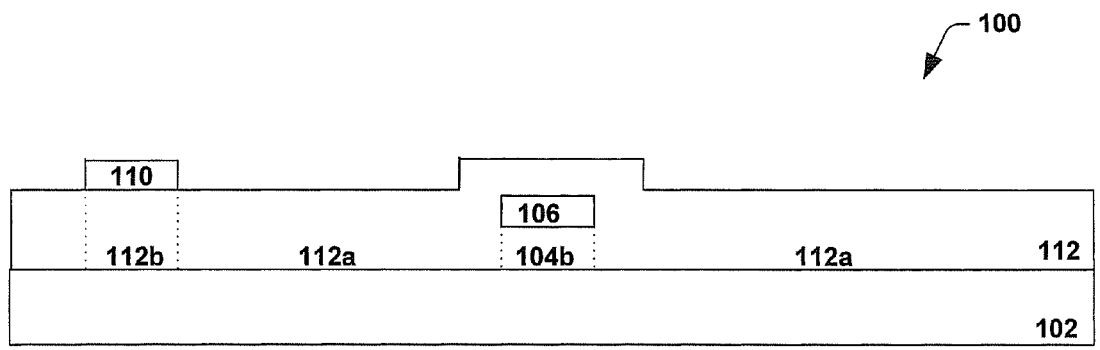
FIG. 4 is a cross sectional illustration of one aspect of a making a mask for another gate thickness of a multiple gate thicknesses structure in accordance with the subject invention.

Referring to FIG. 4, the second hard or etch mask layer 110 is patterned on structure 100 so that subsequently formed second gate portions 112b of the first combined gate layer 112 (exposed portions 104a of the first gate layer 104 and portions of the second gate layer 108) remain covered/protected by the patterned second etch mask layer 110 (that is, 112b corresponds to portions of the first combined gate layer 112 underneath the patterned second etch mask layer 110) while other portions 112a of the first combined gate layer 112 are exposed. The second etch mask layer 110 can be patterned using suitable photolithography techniques. The patterned second etch mask layer 110 defines one or more subsequently formed gates having a second thickness, the second thickness different from the thickness of the gates formed by the patterned first etch mask layer 106.

Due to the high etch selectivity between the materials of the etch mask layer and the gate material, the exposed portions 112a of the first combined gate layer 112 are unaltered (or at least substantially unaltered). The same etch materials described above in connection with FIG. 2 may be employed (not described here for brevity). The structure 100 may then be optionally cleaned to remove residue from the exposed portions 112a of the first combined gate layer 112.

Figure 5:
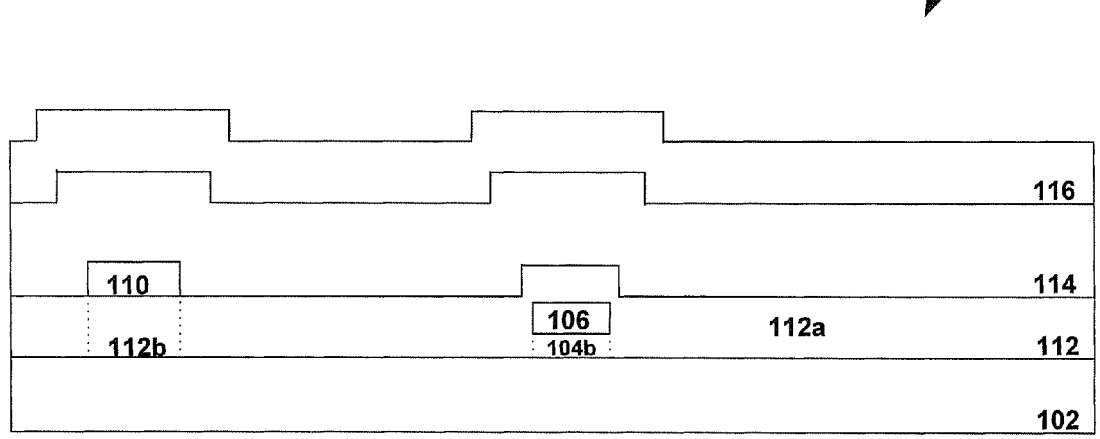
FIG. 5 is a cross sectional illustration of one aspect of a making a multiple gate thicknesses structure in accordance with the subject invention.

Referring to FIG. 5, a third gate layer 114 is formed over a portion or the entire structure 100. The third gate layer 114 is formed to have any suitable thickness, although the thickness combined with the thicknesses of the first gate layer 104 and second gate layer 108 corresponds to the subsequently formed third gate thickness.

The third gate layer 114 may be formed in any suitable manner including CVD, for example. The thickness of the third gate layer 114 is typically from about 100 Å to about 5,000 Å. In another embodiment, the thickness of the third gate layer 114 is from about 250 Å to about 2,500 Å. In another embodiment, the thickness of the third gate layer 114 is from about 500 Å to about 2,000 Å.

Over a portion but typically the entire third gate layer 114, a third hard or etch mask layer 116 is formed. The third etch mask layer 116 can be a thin layer of a material that can provide etch selectivity with the gate material. The third etch mask layer 116 has a suitable thickness to function as a hard mask for subsequently etching portions of the third gate layer 114, second gate layer 108, and the first gate layer 104, but yet a relative thinness to facilitate overall processing. For example, the thickness of the third etch mask layer 116 is about 2,500 Å or less. In another embodiment, the thickness of the third etch mask layer 106 is about 1,000 Å or less.

Examples of materials that may be employed to make the third etch mask layer 116 are the same as those of the second etch mask layer 110 and the first etch mask layer 106. However, each of the third etch mask layer 116, second etch mask layer 110, and first etch mask layer 106 are the same or different from each other (each etch mask layer material is independently selected).

Figure 6:
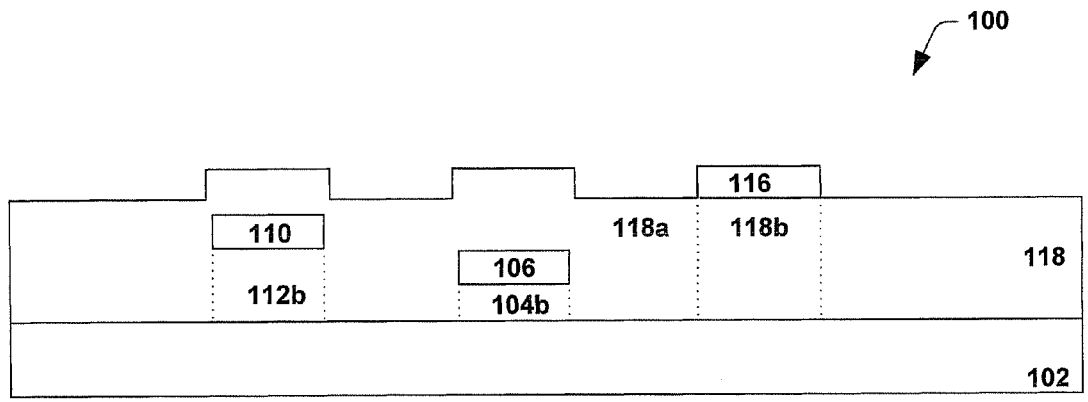
FIG. 6 is a cross sectional illustration of one aspect of a making a mask for yet another gate thickness multiple gate thicknesses structure in accordance with the subject invention.

Referring to FIG. 6, the third etch mask layer 116 is patterned on structure 100 so that subsequently formed third gate portions 118b of the second combined gate layer 118 (exposed portions 104a of the first gate layer 104, exposed portions 112a of the first combined gate layer 112, and portions of the third gate layer 114) remain covered/protected by the patterned third etch mask layer 116 (that is, 118b corresponds to portions of the second combined gate layer 118 underneath the patterned third etch mask layer 116) while other portions 118a of the second combined gate layer 118 are exposed. The third etch mask layer 116 can be patterned using suitable photolithography techniques. The patterned third etch mask layer 116 defines one or more subsequently formed gates having a third thickness, different from both the thicknesses of gates defined by the first and second etch mask layers.

Due to the high etch selectivity between the materials of the etch mask layer and the gate material, the exposed portions 118a of the second combined gate layer 118 are unaltered (or at least substantially unaltered). The same etch materials described above in connection with FIG. 2 may be employed (not described here for brevity). The structure 100 may then be optionally cleaned to remove residue from the exposed portions 118a of the second combined gate layer 118.

Although not shown, the acts of forming additional gate layers, forming additional etch mask layers, and patterning the additional etch mask layers can be repeated one or more times to obtain a desired number of different gate thicknesses. For example, one additional act of forming a fourth gate layer, forming a fourth etch mask layer, and patterning the fourth etch mask layer can provide four sets of gates (each of the four sets having different thicknesses). As another example, two additional acts of forming additional gate layers, forming additional etch mask layers, and patterning the additional etch mask layers can be conducted to obtain five different gate thicknesses. The methods can be even used to form six, seven, eight, nine, and so on sets of gates, each set of gates having different thicknesses from each other.

Figure 7:
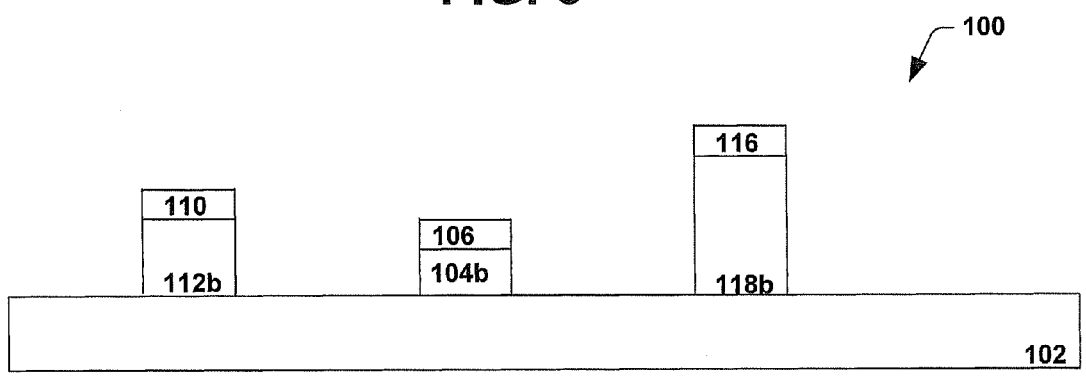
FIG. 7 is a cross sectional illustration of one aspect of a making a multiple gate thicknesses structure in accordance with the subject invention.

Referring to FIG. 7, the structure 100 is subjected to etching treatment to selectively remove unprotected portions (118a of FIG. 6) of the second combined gate layer (118 of FIG. 6) while the patterned first etch mask layer 106, patterned second etch mask layer 110, and patterned third etch mask layer 116 function as etch stop layers thereby protecting portions 104b, 112b, and 118b of the second combined gate layer. Each of the patterned first etch mask layer 106, patterned second etch mask layer 110, and patterned third etch mask layer 116 defines one or more gates 104b, 112b, and 118b having different thicknesses.

The etching treatment is anisotropic so that the gate material underneath the patterned first etch mask layer 106, patterned second etch mask layer 110, and patterned third etch mask layer 116 is not removed. The etching treatment is selective to the gate material versus the material of the etch mask layers. The specific etchant employed to remove selected portions of the gate layer without removing patterned first etch mask layer 106, patterned second etch mask layer 110, and patterned third etch mask layer 116 depends upon the specific identity of the materials of the patterned first etch mask layer 106, patterned second etch mask layer 110, and patterned third etch mask layer 116 (that is, the etch is highly selective to removing the gate material versus the etch mask layer materials). Dry etch techniques are typically employed. Examples of etchants for removing selected portions of the gate layer include a plasma containing fluorine or chlorine compounds, such as one or more of $BCl_3$, $CCl_4$, $SiCl_4$, $Cl_2$, HF, HBr, $NF_3$, $SF_6$, $CH_3F$, $CF_4$, and $CHF_3$. In one embodiment, reactive ion etching (RIE) is employed.

Figure 8:
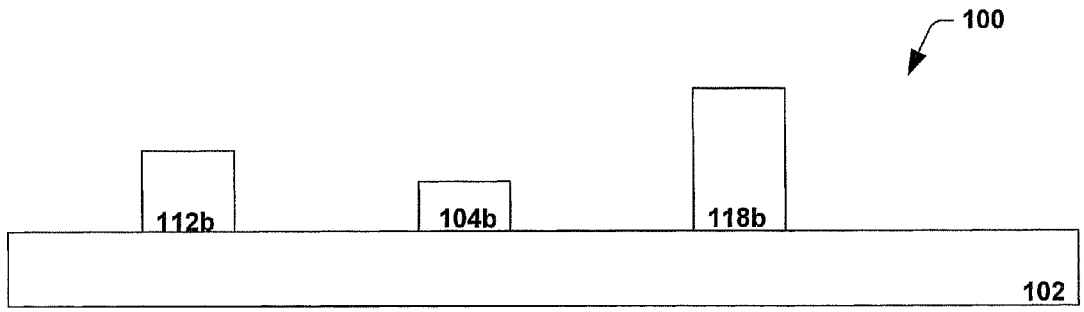
FIG. 8 is a cross sectional illustration of one aspect of a making a multiple gate thicknesses structure having three different thicknesses in accordance with the subject invention.

Referring to FIG. 8, the structure 100 may be subjected to a treatment to remove the patterned first etch mask layer 106, patterned second etch mask layer 110, and patterned third etch mask layer 116 from the structure 100 without substantially damaging or degrading the gates 104*b*, 112*b*, and 118*b*. For example, any of the etchants described in connection with FIG. 2 may be employed. The structure 100 may then be optionally cleaned to remove residue from over and around the gates 104*b*, 112*b*, and 118*b*.

Gates 104*b*, 112*b*, and 118*b* each have a thickness different from the other. Although only one gate of a unique thickness is shown, each of gates 104*b*, 112*b*, and 118*b* may represent a plurality of gates having the thickness. For example, a first plurality of gates 104*b* may have a first thickness, a second plurality of gates 112*b* may have a second thickness, and a third plurality of gates 118*b* may have a third thickness.

Generally speaking, the thickness of each of the gates 104*b*, 112*b*, and 118*b* is from about 100 Å to about 15,000 Å. In another embodiment, the thickness of each of the gates 104*b*, 112*b*, and 118*b* is from about 200 Å to about 10,000 Å. The difference in thickness between any two gates of different thickness is at least about 100 Å. In another embodiment, the difference in thickness between any two gates of different thickness is at least about 250 Å. In yet another embodiment, the difference in thickness between any two gates of different thickness is at least about 400 Å.

This is particularly advantageous when making a nonvolatile memory since a discrete set of transistors for the core cell (non-volatile memory cells) having gates of a different thickness from the thickness of high speed CMOS (Vcc) gates, which in turn has a thickness different from the thickness of high voltage circuitry gates. For example when making a nonvolatile memory, a first gate thickness can be made in the core region, gates having a second gate thickness can be made in the periphery region, and gates having a third gate thickness can be made in the periphery region.

As a result of the methods described herein, a semiconductor structure having at least two gates of different thickness is provided, although a semiconductor structure having at least three gates of different thickness may be provided, a semiconductor structure having at least four gates of different thickness may be provided, and a semiconductor structure having at least five gates of different thickness may be provided.

The methods described herein may be adapted to making various device structures with different thicknesses including gates, wordlines, bit lines, etc. The methods described herein may be used with any suitable semiconductor technology including but not limited to NMOS, PMOS, CMOS, BiCMOS, bipolar, multi-chip modules (MCM), III-IV semiconductors, volatile memory, and nonvolatile memory.

With respect to any figure or numerical range for a given characteristic, a figure or a parameter from one range may be combined with another figure or a parameter from a different range for the same characteristic to generate a numerical range.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making a semiconductor structure having at least two gates of different thickness, comprising:
    forming a first gate layer having a first thickness over a substrate;
    patterning a first hard mask over a portion of the first gate layer to define a first gate underneath the first hard mask having a first gate thickness;
    forming a second gate layer having a second thickness over the first gate layer and the first hard mask;
    patterning a second hard mask over a portion of the second gate layer to define a second gate underneath the second hard mask having a second gate thickness;
    forming a third gate layer having a third thickness over the second gate layer and the second hard mask;
    patterning a third hard mask over a portion of the third gate layer to define a third gate underneath the third hard mask having a third gate thickness;
    removing portions of the first gate layer, the second gate layer, and the third gate layer that are not under the first hard mask, the second hard mask, and the third hard mask; and
    removing the first hard mask, the second hard mask and the third hard mask to provide three gates of different thicknesses.

2. The method of claim 1, further comprising:
    forming a fourth gate layer having a fourth thickness over the third gate layer and the third hard mask;
    patterning a fourth hard mask over a portion of the fourth gate layer to define a fourth gate underneath the fourth hard mask having a fourth gate thickness;
    removing portions of the first gate layer, the second gate layer, the third gate layer, and the fourth gate layer that are not under the first hard mask, the second hard mask, the third hard mask, and the fourth hard mask; and
    removing the first hard mask, the second hard mask, the third hard mask, and the fourth hard mask to provide four gates of different thicknesses.

3. The method of claim 1, further comprising:
    forming a fourth gate layer having a fourth thickness over the third gate layer and the third hard mask;
    patterning a fourth hard mask over a portion of the fourth gate layer to define a fourth gate underneath the fourth hard mask having a fourth gate thickness;
    forming a fifth gate layer having a fifth thickness over the fourth gate layer and the fourth hard mask;
    patterning a fifth hard mask over a portion of the fifth gate layer to define a fifth gate underneath the fifth hard mask having a fifth gate thickness;
    removing portions of the first gate layer, the second gate layer, the third gate layer, the fourth gate layer, and the fifth gate layer that are not under the first hard mask, the second hard mask, the third hard mask, the fourth hard mask, and the fifth hard mask; and removing the first hard mask, the second hard mask, the third hard mask, the fourth hard mask, and the fifth hard mask to provide gates of five different thicknesses.

4. The method of claim 1, wherein the first hard mask and the second hard mask independently comprise silicon dioxide or silicon nitride.

5. The method of claim 1, wherein the first gate thickness is at least about 100 Angstroms (Å) less than the second gate thickness.

6. The method of claim 1, wherein the first gate thickness is at least about 100 Angstroms (Å) less than the second gate thickness, and the second gate thickness is at least about 100 Angstroms (Å), less than the third gate thickness.

7. The method of claim 1, wherein etch selectivity between the first hard mask and the first gate layer and between the second hard mask and the second gate layer is at least about 10:1.

8. The method of claim 1, wherein removing portions of the first gate layer and the second gate layer that are not under the first hard mask and the second hard mask comprises an anisotropic etch.

9. A method of making a non-volatile semiconductor structure having a first gate thickness in a core region and a second gate thickness in a periphery region, comprising:
    forming a first gate layer having a first thickness over a substrate in the core region and the periphery region;
    patterning a first hard mask over a portion of the first gate layer in the core region to define a first gate thickness underneath the first hard mask;
    forming a second gate layer having a second thickness over the first gate layer and the first hard mask;
    patterning a second hard mask over a portion of the second gate layer in the periphery region to define a second gate thickness underneath the second hard mask;
    forming a third gate layer having a third thickness over the second gate layer and the second hard mask;
    patterning a third hard mask over a portion of the third gate layer in the periphery region to define a third gate thickness underneath the third hard mask;
    removing portions of the first gate layer, and the second gate layer, and the third gate layer that are not under the first hard mask, and the second hard mask, and the third hard mask; and
    removing the first hard mask, and the second hard mask, and the third hard mask to provide gates having the first gate thickness in the core region, and gates having the second gate thickness in the periphery region, and gates having the third gate thickness in the periphery region.

10. The method of claim 9, wherein the gates having the first gate thickness in the core region form an M×N array of memory cells.

11. The method of claim 9, wherein the gates having the second gate thickness in the periphery region form high voltage transistors.

12. The method of claim 9, wherein the first gate thickness is at least about 100 Angstroms (Å) less than the second gate thickness.

13. The method of claim 9, wherein the first gate thickness is at least about 250 Angstroms (Å), less than the second gate thickness, and the second gate thickness is at least about 250 Angstroms (Å) less than the third gate thickness.

14. The method of claim 9, wherein the first hard mask and the second hard mask individually comprise silicon oxide, silicon nitride, silicon oxynitride, fluorine doped silicon glass, tetraethylorthosilicate, phosphosilicate glass, borophosphosilicate glass, or a low k polymer material.

15. The method of claim 9, wherein etch selectivity between the first hard mask and the first gate layer, between the second hard mask and the second gate layer, and between the third hard mask and the third gate layer is at least about 25:1.

16. A method of making a non-volatile semiconductor structure having a first gate thickness, a second gate thickness, and a third gate thickness, comprising:
    forming a first gate layer having a first thickness over a substrate;
    patterning a first silicon oxide hard mask over a portion of the first gate layer to define a first gate thickness underneath the first silicon oxide hard mask;
    forming a second gate layer having a second thickness over the first gate layer and the first silicon oxide hard mask;
    patterning a second silicon oxide hard mask over a portion of the second gate layer to define a second gate thickness underneath the second silicon oxide hard mask;
    forming a third gate layer having a third thickness over the second gate layer and the second silicon oxide hard mask;
    patterning a third silicon oxide hard mask over a portion of the third gate layer to define a third gate thickness underneath the third silicon oxide hard mask;
    removing portions of the first gate layer, the second gate layer, and the third gate layer that are not under the first silicon oxide hard mask, the second silicon oxide hard mask, and the third silicon oxide hard mask; and
    removing the first silicon oxide hard mask, the second silicon oxide hard mask, and the third silicon oxide hard mask to provide gates having the first gate thickness, gates having the second gate thickness, and gates having the third gate thickness.

17. The method of claim 16, wherein the first gate thickness is at least about 100 Angstroms (Å) less than the second gate thickness, and the second gate thickness is at least about 100 Angstroms (Å) less than the third gate thickness.

18. The method of claim 16, wherein etch selectivity between the first hard mask and the first gate layer, between the second hard mask and the second gate layer, and between the third hard mask and the third gate layer is at least about 10:1.

19. The method of claim 1, wherein forming the first gate layer further comprises forming the first gate layer over the core region of the substrate.

20. The method of claim 1, wherein forming the second gate layer further comprises forming the second gate layer over the periphery of the substrate.

\* \* \* \* \*